United States Patent
Fei et al.

(10) Patent No.: US 10,712,154 B2
(45) Date of Patent: Jul. 14, 2020

(54) LASER LEVEL

(71) Applicant: LEICA GEOSYSTEMS AG, Heerbrugg (CH)

(72) Inventors: Kai Fei, Changzhou (CN); Guanghua Ma, Changzhou (CN); Thomas Bösch, Lustenau (AT)

(73) Assignee: LEICA GEOSYSTEMS AG, Heerbrugg (CH)

( * ) Notice: Subject to any disclaimer, the term of this patent is extended or adjusted under 35 U.S.C. 154(b) by 234 days.

(21) Appl. No.: 16/029,349

(22) Filed: Jul. 6, 2018

(65) Prior Publication Data

US 2019/0011258 A1    Jan. 10, 2019

(30) Foreign Application Priority Data

Jul. 7, 2017 (EP) .................................... 17180392

(51) Int. Cl.
| | | |
|---|---|---|
| *G01C 15/02* | (2006.01) | |
| *G01C 15/00* | (2006.01) | |
| *G02B 27/30* | (2006.01) | |
| *H01S 5/022* | (2006.01) | |

(52) U.S. Cl.
CPC .......... *G01C 15/004* (2013.01); *G02B 27/30* (2013.01); *H01S 5/02252* (2013.01); *H01S 5/02288* (2013.01); *H01S 5/02292* (2013.01)

(58) Field of Classification Search
CPC ................................................... G01C 15/004
USPC ........................................................... 33/290
See application file for complete search history.

(56) References Cited

U.S. PATENT DOCUMENTS

| | | | |
|---|---|---|---|
| 2004/0207848 A1 | 10/2004 | Dang | |
| 2005/0029459 A1* | 2/2005 | Gotz | G01B 11/0658 |
| | | | 250/353 |
| 2005/0068626 A1 | 3/2005 | Dang et al. | |
| 2007/0271800 A1 | 11/2007 | Hersey et al. | |
| 2010/0195697 A1* | 8/2010 | Hollander | G01J 5/0275 |
| | | | 374/121 |

(Continued)

FOREIGN PATENT DOCUMENTS

WO    00/70375 A1    11/2000

OTHER PUBLICATIONS

European Search Report dated Jan. 15, 2018 as received in Application No. EP17180392.

*Primary Examiner* — George B Bennett
(74) *Attorney, Agent, or Firm* — Maschoff Brennan

(57) ABSTRACT

A laser level comprising a first laser module and a second laser module, each comprising a laser diode and an optical unit, a holder arranging the first laser module and the second laser module in a fixed relative position, and a housing, in which the holder is suspended with a gimbal or ball joint. Each optical unit comprises a collimating lens arranged along the beam path following the laser diode, and configured for collimating a beam emitted by the laser diode; a pair of partially transmitting mirrors, each arranged along the beam path following the collimating lens, and configured for laterally reflecting less than half of the collimated beam in terms of the beam cross-section, and in terms of the beam intensity; and a cylindrical lens arranged along the beam path following the pair of partially transmitting mirrors, and configured for shaping the collimated beam into a fan beam.

17 Claims, 5 Drawing Sheets

(56) References Cited

U.S. PATENT DOCUMENTS

| | | | |
|---|---|---|---|
| 2011/0131824 A1* | 6/2011 | Yanobe | G01C 15/00 33/292 |
| 2011/0167656 A1* | 7/2011 | Huang | H01S 5/005 33/286 |
| 2015/0052763 A1* | 2/2015 | Zhang | G01C 15/004 33/281 |
| 2015/0292886 A1* | 10/2015 | Bascom | G01C 15/004 33/291 |
| 2019/0107392 A1* | 4/2019 | Bosch | G01S 17/08 |

* cited by examiner

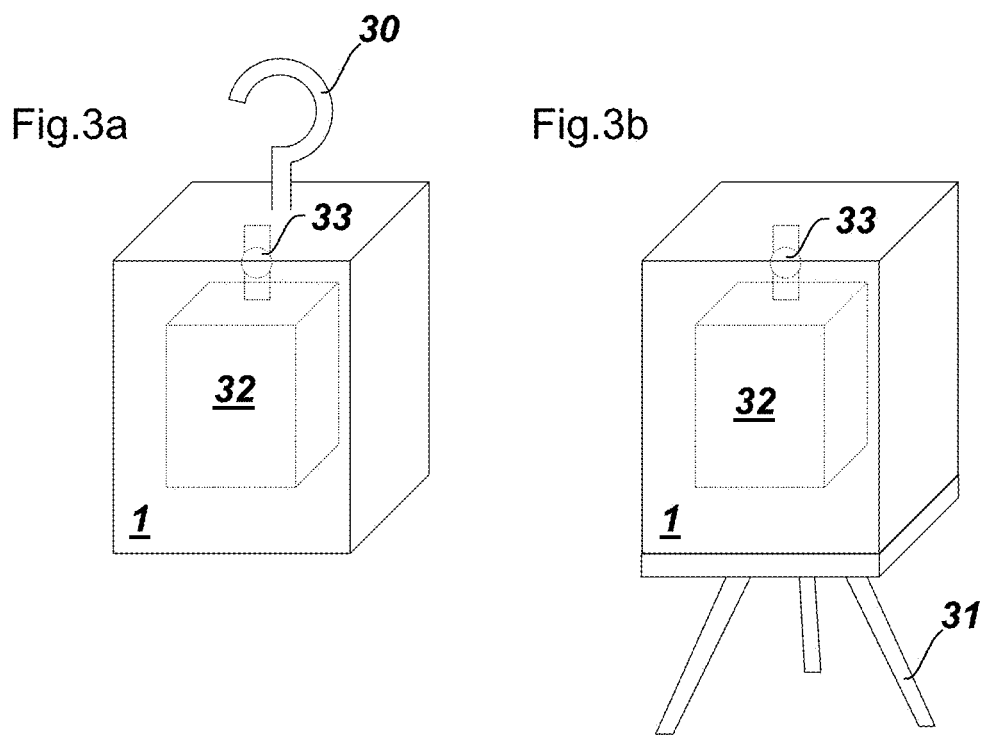
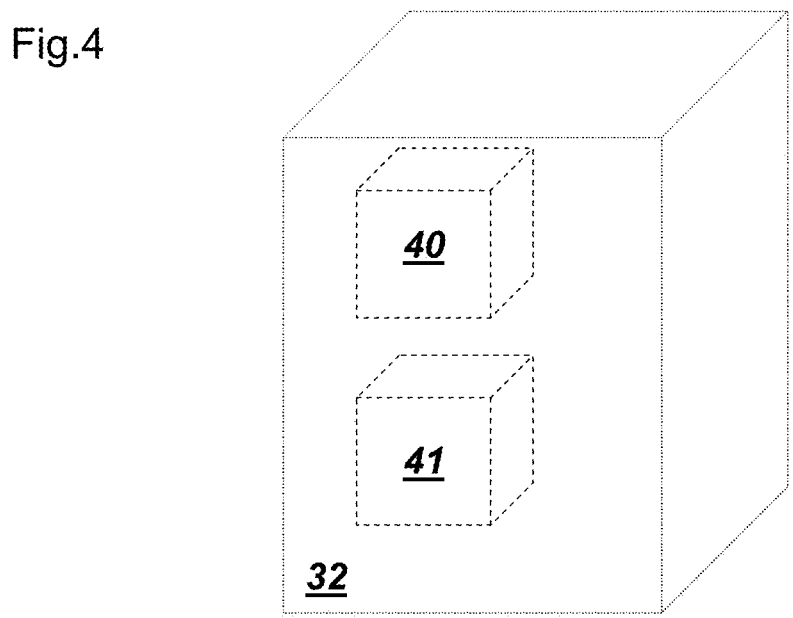

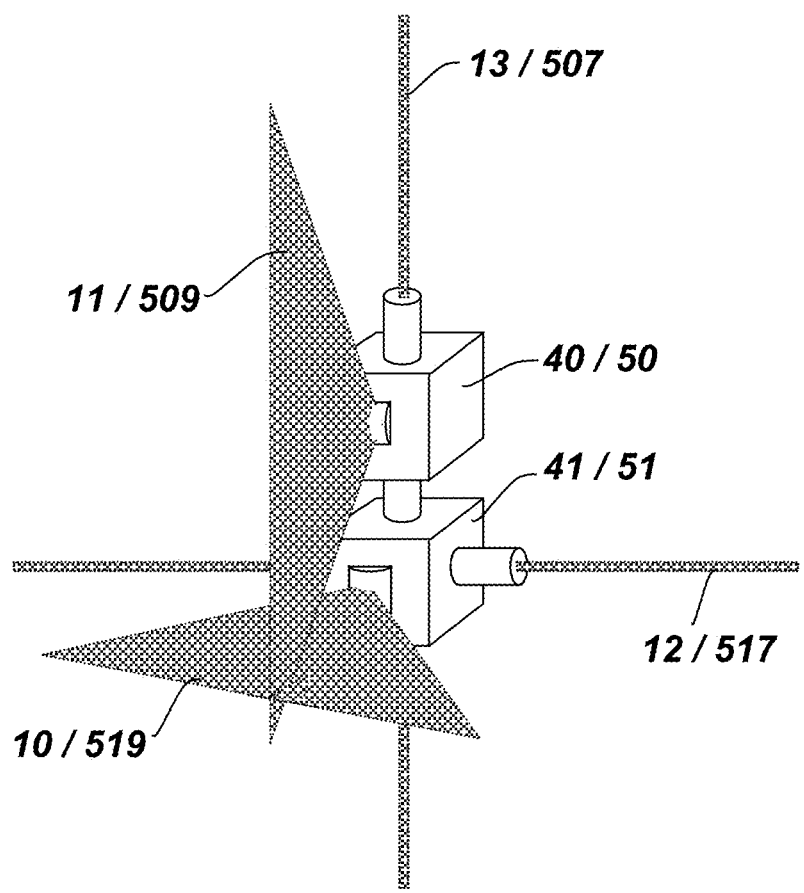

LASER LEVEL

CROSS-REFERENCE TO RELATED APPLICATIONS

This application claims priority to European Patent Application No. 17180392.7 filed on Jul. 7, 2017. The foregoing patent application are incorporated herein by reference.

FIELD OF INVENTION

The present invention relates to a laser level.

BACKGROUND

Laser levels, or also generally referred to as laser projection instruments, are a popular type of optical support equipment, e.g. at construction sites, and commonly use laser diodes with wave lengths of green or red for projecting visible points, and/or horizontal and/or vertical lines on a wall, floor and/or ceiling.

The level is manually aligned ("levelled") by directing the projection line towards a target point, so that corresponding projections in defined angles relative to the target point (in particular 90° and 180°) can be provided. Mainly, laser levels are used for installation of interior decoration, doors, windows, pipelines, tunnels, or for inspections and engineering supervision.

The laser level according to the present invention is configured to provide laser fan beams to project a horizontal reference line and a vertical reference line, and to provide spot beams to project reference points in four spatial directions.

For this purpose, the laser level comprises at least one, and in particular two, laser modules with a laser source each. The laser modules may be arranged on top of each other and both respectively split up the beam generated by the laser source with a pair of partially transmitting mirrors.

The diverted parts of the beams provide the spot beams, and the fan beams are provided by the parts of beams which transmit through the partially transmitting mirrors and the parts of beams which pass past the partially transmitting mirrors.

BRIEF DESCRIPTION

Some embodiments of the invention relate to a laser level comprising a first laser module and in particular also a second laser module, each laser module comprising a laser diode and an optical unit, a holder arranging the first laser module and the second laser module in a fixed relative position, and a housing, in which the holder is suspended with a gimbal or ball joint, wherein each of the optical units comprises a collimating lens arranged along the beam path following the laser diode, and configured for collimating a beam emitted by the laser diode; a pair of partially transmitting mirrors, each arranged along the beam path following the collimating lens, and configured for laterally reflecting less than half of the collimated beam in terms of the beam cross-section, and in terms of the beam intensity; and a cylindrical lens arranged along the beam path after the pair of partially transmitting mirrors, and configured for shaping the incoming beam, i.e. consisting of the parts of the collimated beam which transmitted through the pair of partially transmitting mirrors and the part of the collimated beam which bypassed the pair of partially transmitting mirrors, into a fan beam.

Each of the partially transmitting mirrors may be inclined by 45° relative to the collimated beam, such that two reflected beams are diverted from the collimated beam into opposite directions.

At least one of the first laser module and the second laser module may comprise at least one pair of apertures for allowing the reflected beams to laterally leave the optical unit.

Each of the partially transmitting mirrors may be arranged in a fringe region of the collimated beam.

The partially transmitting mirrors may be configured for reflecting 10% of the collimated beam in terms of the beam intensity.

The pairs of partially transmitting mirrors may be arranged such that the reflected beams generated by the first laser module and the reflected beams generated by the second laser module are aligned in a 90° angle relative to each other.

The cylindrical lenses may be arranged such that the planes of the fan beams are crossing in a 90° angle.

At least one of the optical units may comprise a deflection lens for deviating the collimated beam in an elevative angle, wherein the deflection lens is arranged along the beam path between the pair of partially transmitting mirrors and the cylindrical lens.

The first laser module and the second laser module may be arranged on top of each other.

The partially transmitting mirrors may be wedge-shaped plates with regard to their cross-sections.

The partially transmitting mirrors may be shaped rectangular or round with regard to their contour perpendicular to their surface or perpendicular to the beam entry.

The partially transmitting mirrors may consist of a uniform semi-permeable material.

The partially reflecting mirrors may have a non-uniform partially reflective coating with comprising a gradient of the reflection constant in one or to dimensions.

A gradient of the reflection constant of the coating material in form of a decrease towards the edges of the partial-reflectors can help to improve the quality and shape of the emitted beam by reducing diffraction effects.

Another possibility is to use transparent (glass or polymer) plates within the main collimated beam (covering e.g. half of the cross section) having a round, rectangular or elliptic section of partially reflective coating, which has a central maximum of reflectivity, gradually tapered to zero towards the perimeter of the zone (ideally a Gaussian gradient).

One of the first laser module and the second laser module may be configured to generate vertical reflected beams and a fan beam with a vertical plane, and the other of the first laser module and the second laser module may be configured to generate a horizontal reflected beams and a fan beam with a horizontal plane.

One of the first laser module and the second laser module may be configured to generate vertical reflected beams and a fan beam with a horizontal plane, and the other of the first laser module and the second laser module may be configured to generate horizontal reflected beams and a fan beam with a vertical plane.

The axis of the vertical reflected beam and the axis of the horizontal reflected beam may meet between the two partially transmitting mirrors of one of the first laser module and the second laser module.

BRIEF SUMMARY OF THE DRAWINGS

In the following, the invention will be described in detail by referring to exemplary embodiments that are accompanied by figures, in which:

FIG. 3a-b: shows an abstract view of the laser level according to the invention and its interior;

FIG. 4: shows a further abstract view of the laser level according to the invention and its interior;

FIG. 6: shows an embodiment of a combination of two of the exemplary laser modules for a laser level according to the invention;

DETAILED DESCRIPTION

Figure 1:
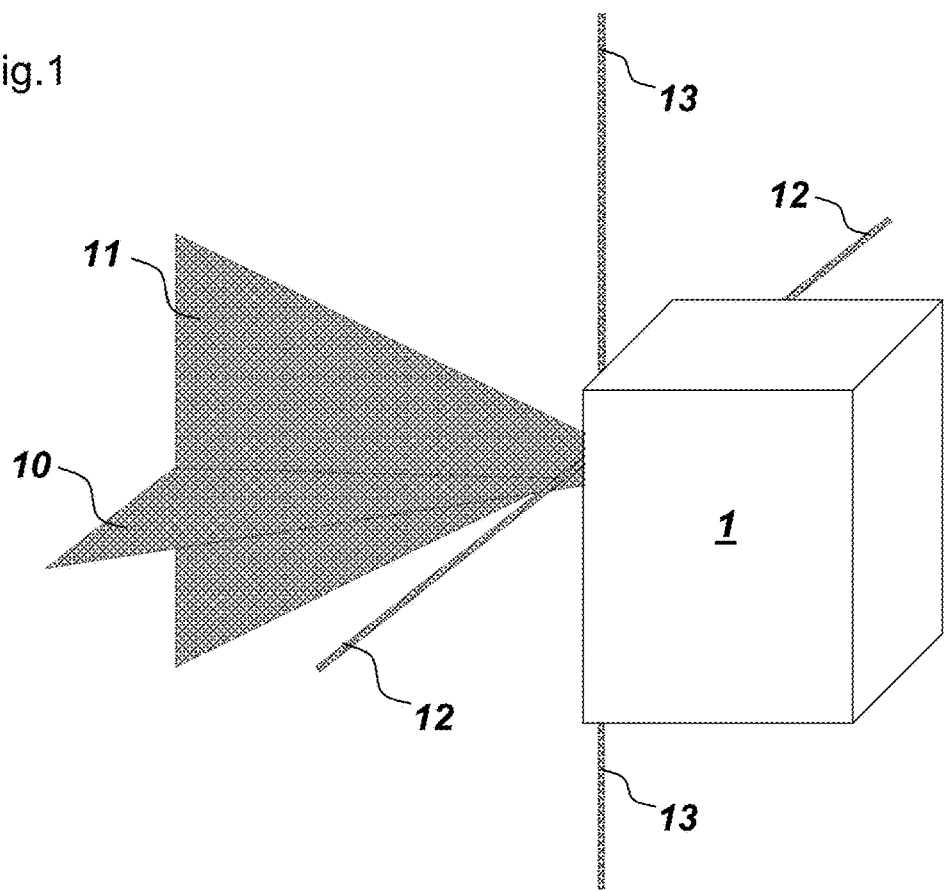
FIG. 1: shows an abstract view of the laser level according to the invention.

FIG. 1 shows a laser level 1 according to the invention in a perspective view. The laser level 1 is configured to transmit a first fan beam 10, a second fan beam 11, a first spot beam 12, and a second spot beam 13.

Figure 2:
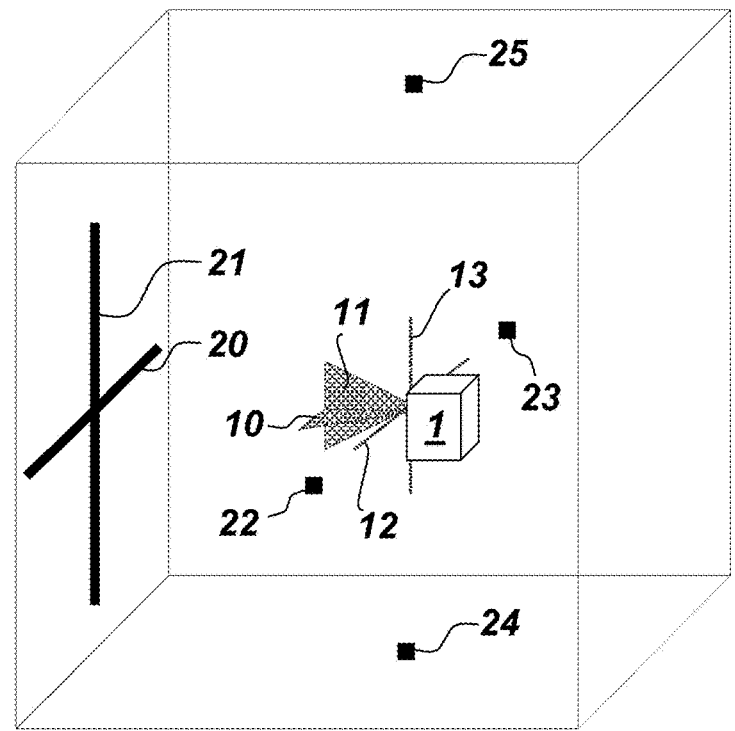
FIG. 2: shows an abstract view of the laser level according to the invention and the projections that it is configured to provide on the walls of a room.

FIG. 2 shows the resulting projections in a room. The fan beams 10 and 11 are projecting a cross comprising the lines 20 and 21 onto the wall fronting the laser level 1. The spot beams 12 and 13 are projecting light points 22 and 23 onto the walls lateral to the laser level 1, and light points 24 and 25 onto the floor and ceiling.

FIGS. 3a and 3b show two different features for a setup of the laser level 1. The laser level 1 may have a hook 30 or any comparable kind of fixture enabling to hang the laser level 1 (FIG. 3a). The laser level 1 may also or alternatively have, or be configured to be attached to, a tripod 31 (FIG. 3b).

FIGS. 3a and 3b further show the suspension 33 of a holder 32 within the housing of the laser level 1. The suspension 33 may be embodied as a gimbal, a ball joint, or any comparable kind of suspension which allows two-axis pendulum movability of the holder 32 in order to compensate an oblique alignment of the housing of the line laser 1. In particular the movability is limited to some extent. Gravity causes the holder 32 to always align straight. The suspension 33 may be damped in order to stabilise a rest position and avoid pendulum movements.

As shown in FIG. 4, the holder 32 shown in FIGS. 3a and 3b carries at least a first laser module 40 and a second laser module 41. The first laser module 40 may be one of the laser modules 50, 51, and 52 as shown in FIGS. 5a, 5b, and 5c.

Figure 5A:
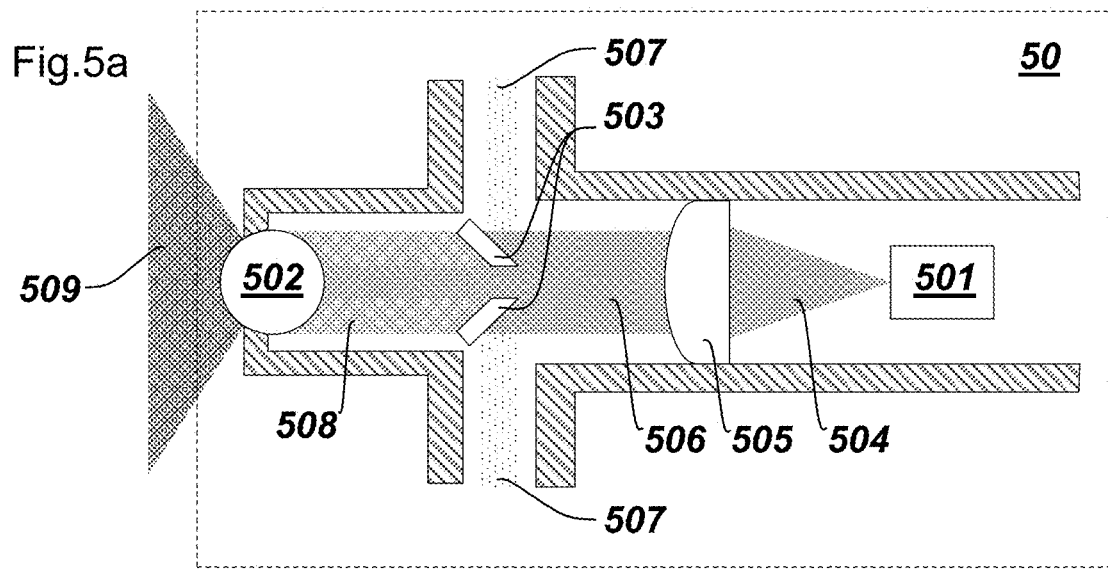
FIG. 5a-e: show embodiments of the laser modules usable in a laser level according to the invention.
Figure 5B:
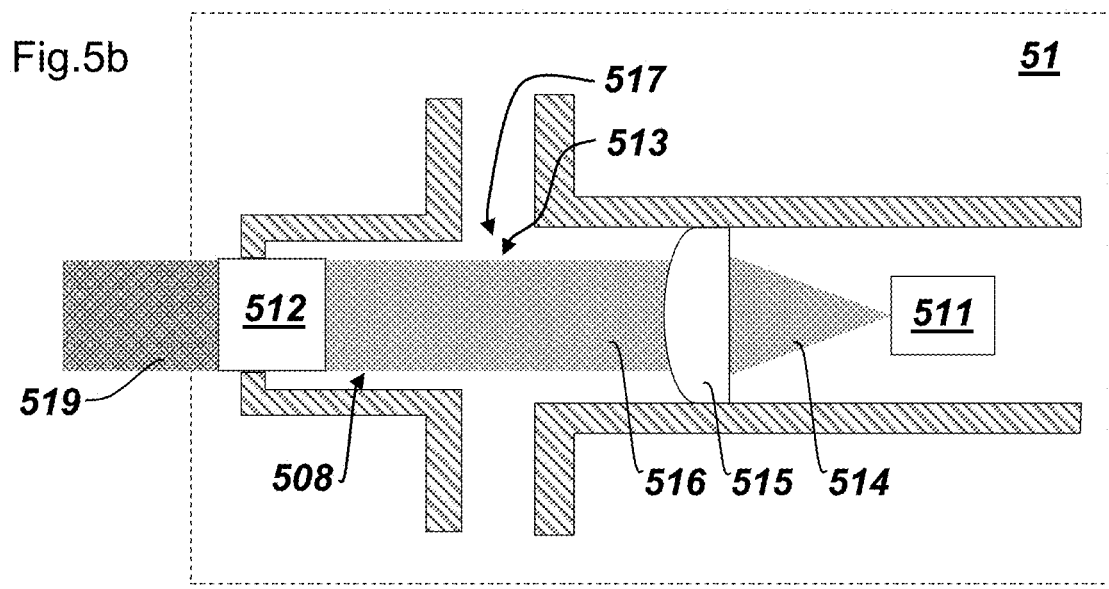
Figure 5C:
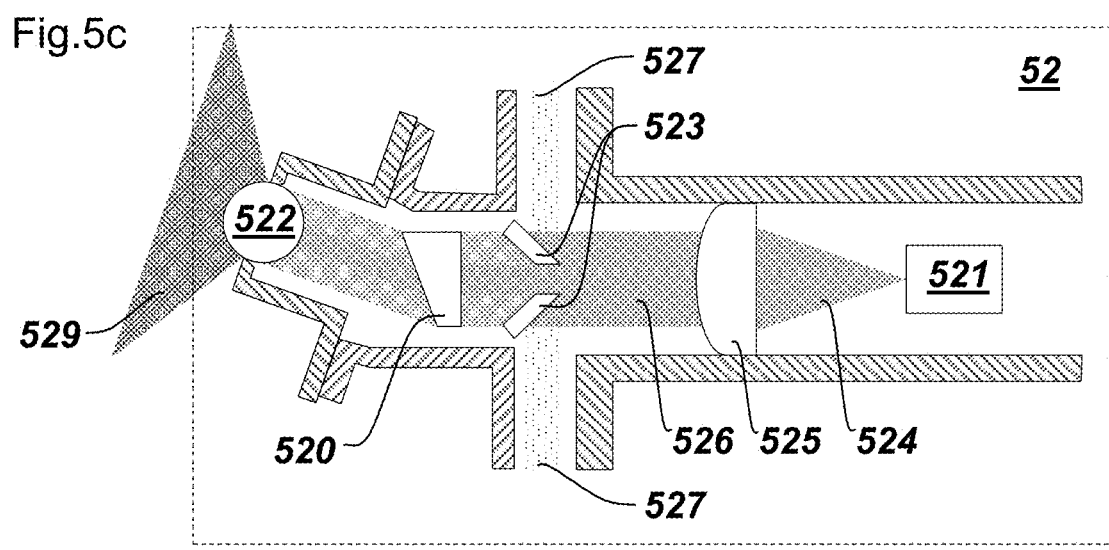

If laser module 40 is a laser module 50 as shown in FIG. 5a or a laser module 52 as shown in FIG. 5c, then laser module 41 may be laser module 51 according to FIG. 5b.

If laser module 40, however, is a laser module 51 as shown in FIG. 5b, then laser module 41 may be embodied as laser module 50 according to FIG. 5a or as laser module 52 according to FIG. 5c.

FIGS. 5a, 5b, and 5c show different embodiments of the laser module of the laser level according to the invention in a side view. They all have in common that their optical unit comprises a collimating lens, two partially transmitting mirrors, and a cylindrical lens. The partially transmitting mirrors are conditioned in one piece and have an equal, consistent property. They are designed to allow most light to pass through, in particular to allow 90% of light to pass through. The smaller portion of the light intensity is reflected. Due to their equally distributed semi-permeable consistency, the radiation passed through and the radiation reflected are even and their respective beam cross-section have no gradient.

With regard to their respective construction, the laser diodes 501, 511, and 521 are the same in all three laser modules shown in FIGS. 5a, 5b, and 5c, and so are the cylindrical lenses 502, 512, and 522, as well as the partially transmitting mirrors 503, 513, and 523.

From a perspective along the beam path or from a perspective perpendicular to the reflective surface of the partially transmitting mirrors, the partially transmitting mirrors may have any contour but are preferably shaped rectangularly or circularly or in a way combining rectangular and circular elements. From a cross-sectional perspective, as depicted in FIG. 5, the cross-section may be shaped wedge-like or at least essentially rectangularly. The partially transmitting mirrors are inclined with respect to the beam path, in particular inclined by 45° and thereby deflecting the rays by 90° (507, 517, 527).

FIG. 5a shows the beam 504 emitted by the laser diode 501 being collimated by the collimating lens 505. In the outer area of the collimated beam 506, less than half of the collimated beam 506 (with respect to the cross section area) respectively meets each of the two partially transmitting mirrors 503. Accordingly, less than 100% of the collimated beam 506 is affected by the partially transmitting mirrors 503 and more than 0% of the collimated beam 506, hence, travels past the partially transmitting mirrors 503, in particular in the central area of the collimated beam 506, i.e. around the beam axis.

The reflected beam portions 507 are directed to the ceiling and the floor by passing through the laser module, the holder, and the housing of the laser level. In order to allow the reflected beam portions to pass through the other laser module (40/41), said other laser module (40/41) has an according opening to not block the way of the reflected beam (for example as shown in FIG. 5b). The beam portions 507 correspond to the vertical spot beam 13 in FIGS. 1 and 2.

Between the two partially transmitting mirrors 503, the collimated laser beam 506 can pass through unaffected, and where the collimated laser beam 506 passed through the partially transmitting mirrors 503, the larger part of the radiation is continuing its travel, in particular 90% of the intensity. Accordingly, the smaller portion of the according reflected part 507 of the collimated beam is guided laterally out of the beam path, in particular 10% of the intensity.

The beam parts 506 and 508 are entering the cylindrical lens 502 and are fanned out in the fan beam 509, which corresponds to the vertical fan beam 11 in FIGS. 1 and 2.

So far, FIG. 5a has been considered as a side view of the laser module 50. FIG. 5a may however also be considered as top view of the laser module 51 of FIG. 5b. Accordingly, FIG. 5b may also be considered as top view of the laser module 50 of FIG. 5a. In other words, laser module 50 is structurally identical with laser module 51 just that they are flipped relative to each other by 90° about an axis parallel to the beam path.

Under the assumption that FIG. 5b shows a side view of a laser module, this laser module 51 then would render combinable with the laser module 50, i.e. laser module 50 would generate a vertical fan beam 509 and vertical spot beams 507, and laser module 51 would generate a horizontal fan beam 519 and horizontal spot beams 517.

The spot beams 517 are indicated but not directly visible in FIG. 5l due to the cross-sectional view. They are proceeding perpendicular to the paper plane. Accordingly, the partially transmitting mirrors 513 are also not directly visible. They are behind or above the shown collimated beam 516. Also the beam portions 518 permitted by the partially transmitting mirrors 513 are only indicated because they are behind the passed beam portion.

The laser module 52 shown in FIG. 5c renders a particular alternative to the laser module 50. FIG. 5c shows a cross-sectional side view, wherein the difference to the laser module 50 as shown in FIG. 5a is the deflection of the beam path by a deflecting lens 520. This may allow for a more preferred direction of the vertical fan beam 529. The inclination may as well be embodied towards the bottom side.

Figure 5D:
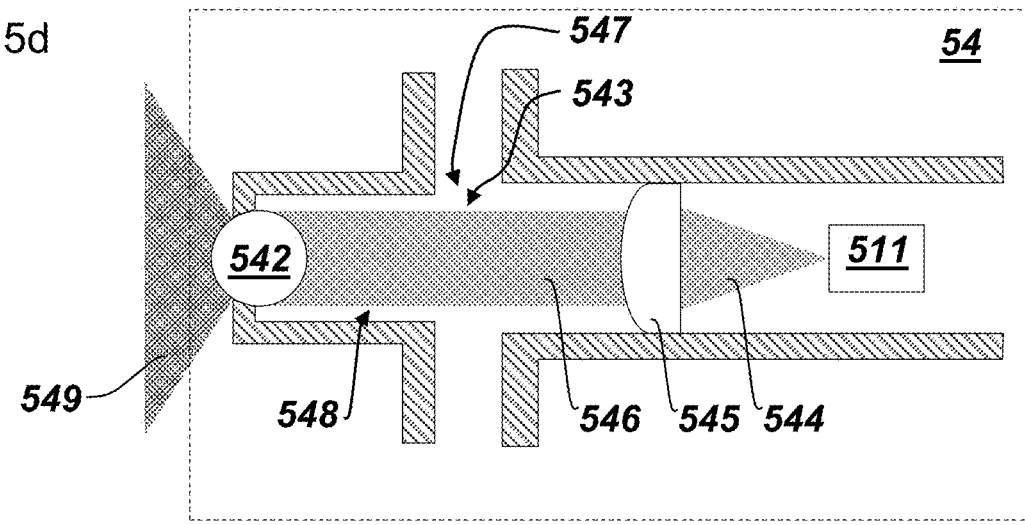
Figure 5E:
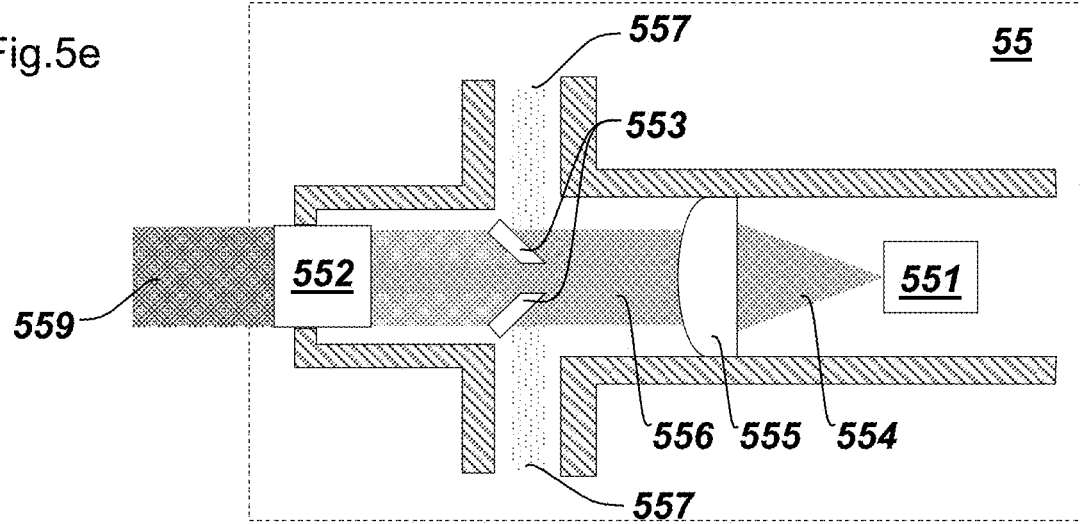

FIGS. 5d and 5e are side views of further embodiments of laser modules.

FIG. 5d shows a laser module 54 being a modified laser module 50. The modification relates to the partially transmitting mirrors 543 being arranged turned by 90° and therefore generating horizontal beams 547 (reflected beams reflected by the partially transmitting mirrors 543).

FIG. 5e shows a laser module 55 being a modified laser module 51 or 50. Respectively, the cylindrical lens 532 is arranged turned by 90° (compared to laser module 50), or the partially transmitting mirrors 543 is arranged turned by 90° (compared to laser module 51). Laser module 55 is generating a horizontal fan beam 559 and a vertical spot beam 557 (reflected beams reflected by the partially transmitting mirrors 553).

For example, laser module 53 can be provided as laser module 40 in FIG. 4. In this case, laser module 41 in FIG. 4 may be embodied as laser module 54. Accordingly, 40 may be embodied as 54 and then 41 can be embodied as 53. Accordingly, the shown laser modules are combinable as providing a horizontal fan beam, a vertical fan beam, a horizontal spot beam, and a vertical spot beam in combination.

FIG. 6 shows an exemplary assembly of the laser modules 50 and 51. A holder 32 according to FIGS. 3 and 4 is not shown, however, "holder" may also be understood abstractly as the assemblage of the two laser modules.

Although the invention is illustrated above, partly with reference to some preferred embodiments, it must be understood that numerous modifications and combinations of different features of the embodiments can be made. All of these modifications lie within the scope of the appended claims.

What is claimed is:

1. A laser level comprising:
    at least a first laser module including:
        a laser diode, and
        an optical unit including:
            a collimating lens arranged along the beam path following the laser diode, and being configured for collimating a beam emitted by the laser diode;
            a pair of partially transmitting mirrors, each arranged along the beam path after the collimating lens, and configured for laterally reflecting less than half of the collimated beam in terms of a beam cross-section and in terms of a beam intensity; and
            a cylindrical lens arranged along the beam path after the pair of partially transmitting mirrors, and configured for shaping:
                (i) the parts of the collimated beam which transmitted through the pair of partially transmitting mirrors, and
                (ii) the part of the collimated beam which bypassed the pair of partially transmitting mirrors into a fan beam;
    a holder for fixing the first laser module in a fixed relative position; and
    a housing, in which the holder is suspended with a gimbal or ball joint.

2. The laser level according to claim 1, wherein each of the partially transmitting mirrors is inclined by 45° relative to the collimated beam, such that two reflected beams are diverted from the collimated beam into opposite directions.

3. The laser level according to claim 1, wherein the first laser module comprises at least one pair of apertures for allowing the reflected beams to laterally leave the optical unit.

4. The laser level according to claim 1 further comprising a second laser module, wherein at least one of the first laser module and the second laser module comprises at least one pair of apertures for allowing the reflected beams to laterally leave the optical unit.

5. The laser level according to claim 1, wherein each of the partially transmitting mirrors is arranged in a fringe region of the collimated beam.

6. The laser level according to claim 1, wherein the partially transmitting mirrors are configured for reflecting 10% of the collimated beam in terms of the beam intensity.

7. The laser level according to claim 4, wherein the pairs of partially transmitting mirrors are arranged such that the reflected beams generated by the first laser module and reflected beams generated by the second laser module are aligned in a 90° angle relative to each other.

8. The laser level according to claim 1, wherein the cylindrical lenses are arranged such that the planes of the fan beams are crossing in a 90° angle.

9. The laser level according to claim 1, wherein at least one of the optical units comprises a deflection lens for deviating the collimated beam in an elevative angle, wherein the deflection lens is arranged along the beam path between the pair of partially transmitting mirrors and the cylindrical lens.

10. The laser level according to claim 4, wherein the first laser module and the second laser module are arranged on top of each other.

11. The laser level according to claim 1, wherein the partially transmitting mirrors are wedge-shaped plates with regard to their cross-sections.

12. The laser level according to claim 1, wherein the partially reflecting mirrors have a non-uniform partially reflective coating with comprising a gradient of the reflection constant in one or two dimensions.

13. The laser level according to claim 1, wherein the partially transmitting mirrors consist of a uniform partially reflecting material.

14. The laser level according to claim 4, wherein one of the first laser module and the second laser module are configured to generate vertical reflected beams and a fan beam with a vertical plane, and the other of the first laser module and the second laser module is configured to generate a horizontal reflected beams and a fan beam with a horizontal plane.

15. The laser level according to claim 4, wherein one of the first laser module and the second laser module is configured to generate vertical reflected beams and a fan beam with a horizontal plane, and the other of the first laser module and the second laser module is configured to generate horizontal reflected beams and a fan beam with a vertical plane.

16. The laser level according to claim 14, wherein the axis of the vertical reflected beam and the axis of the horizontal reflected beam meet between the two partially transmitting mirrors of one of the first laser module and the second laser module.

17. A laser level comprising:
at least a first laser module and second laser module, each including:
a laser diode, and
an optical unit including:
a collimating lens arranged along the beam path following the laser diode, and being configured for collimating a beam emitted by the laser diode;
a pair of partially transmitting mirrors, each arranged along the beam path after the collimating lens, and configured for laterally reflecting less than half of the collimated beam in terms of a beam cross-section and
in terms of a beam intensity; and
a cylindrical lens arranged along the beam path after the pair of partially transmitting mirrors, and configured for shaping:
(i) the parts of the collimated beam which transmitted through the pair of partially transmitting mirrors, and
(ii) the part of the collimated beam which bypassed the pair of partially transmitting mirrors into a fan beam;
a holder for fixing the first laser module and the second laser module, each in a fixed relative position; and
a housing, in which the holder is suspended with a gimbal or ball joint.

* * * * *